(12) United States Patent
Hilt et al.

(10) Patent No.: US 8,530,276 B2
(45) Date of Patent: Sep. 10, 2013

(54) METHOD FOR MANUFACTURING A MICROELECTRONIC DEVICE AND A MICROELECTRONIC DEVICE THUS MANUFACTURED

(75) Inventors: Thierry Hilt, Barraux (FR); Herve Boutry, Vinay (FR); Remy Franiatte, Saint Joseph de Riviere (FR); Stephane Moreau, Le Chevalon de Voreppe (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 173 days.

(21) Appl. No.: 13/093,912

(22) Filed: Apr. 26, 2011

(65) Prior Publication Data

US 2011/0266699 A1    Nov. 3, 2011

(30) Foreign Application Priority Data

Apr. 26, 2010    (FR) ...................... 10 53156

(51) Int. Cl.
*H01L 21/00*    (2006.01)
(52) U.S. Cl.
USPC .................. 438/109; 438/611; 257/E21.575; 257/E25.006; 257/E25.013; 257/E25.018; 257/E25.021
(58) Field of Classification Search
USPC ................................. 438/611, 109
See application file for complete search history.

(56) References Cited

U.S. PATENT DOCUMENTS

| | | | |
|---|---|---|---|
| 5,250,047 A * | 10/1993 | Rydell ............................ 606/48 |
| 5,311,401 A | 5/1994 | Gates, Jr. et al. | |
| 5,475,318 A | 12/1995 | Marcus et al. | |
| 5,976,390 A * | 11/1999 | Muramatsu ........................ 216/2 |
| 5,994,222 A * | 11/1999 | Smith et al. .................... 438/689 |
| 6,183,267 B1 | 2/2001 | Marcus et al. | |
| 6,184,699 B1 * | 2/2001 | Smith et al. ............. 324/755.05 |
| 6,333,207 B1 * | 12/2001 | Light et al. ..................... 438/106 |
| 6,589,859 B2 * | 7/2003 | Petitbon et al. ............... 438/611 |
| 6,627,990 B1 | 9/2003 | Shim et al. | |
| 6,692,145 B2 * | 2/2004 | Gianchandani et al. ...... 374/185 |
| 6,765,287 B1 * | 7/2004 | Lin ............................... 257/686 |

(Continued)

FOREIGN PATENT DOCUMENTS

WO    WO 2009/147148    12/2009

OTHER PUBLICATIONS

Chow et al. "Pressure Contact Micro-Springs in Small Pitch Flip-Chip Packages" *IEEE Transactions on Components and Packaging Technologies*, 29(4): 796-803 (Dec. 2006).

(Continued)

*Primary Examiner* — David Zarneke
(74) *Attorney, Agent, or Firm* — Occhiuti Rohlicek & Tsao LLP

(57) ABSTRACT

The invention pertains to a method for manufacturing a microelectronic device on a substrate comprising at least one first electrical component and one second electrical component distributed respectively in first and second levels stacked one on top of the other on the substrate, this method comprising:
the manufacture of at least one first arm and one second arm of different lengths, each of these arms directly and mechanically linking an electrical pad to a fixed anchoring point on the substrate, and
the electrical pad is made inside the first level and then shifted, prior to the electrical connection of the second component, to a position of connection wherein the upper face of the electrical pad is in contact with the interior of the second level parallel to the substrate.

12 Claims, 6 Drawing Sheets

(56) References Cited

U.S. PATENT DOCUMENTS

| | | | |
|---|---|---|---|
| 6,998,703 B2* | 2/2006 | Di Stefano | 257/686 |
| 7,073,938 B2* | 7/2006 | Gianchandani et al. | 374/185 |
| 7,700,388 B2* | 4/2010 | Tung | 438/30 |
| 7,713,388 B2* | 5/2010 | Chua et al. | 204/192.15 |
| 7,800,208 B2* | 9/2010 | Otremba | 257/678 |
| 8,278,748 B2* | 10/2012 | Lo et al. | 257/692 |
| 8,354,742 B2* | 1/2013 | Camacho et al. | 257/680 |
| 8,404,520 B1* | 3/2013 | Chau et al. | 438/109 |
| 8,409,978 B2* | 4/2013 | Pagaila et al. | 438/611 |
| 8,426,963 B2* | 4/2013 | Zeng et al. | 257/723 |
| 2002/0006685 A1* | 1/2002 | Petitbon et al. | 438/107 |
| 2002/0171133 A1 | 11/2002 | Mok et al. | |
| 2005/0121758 A1 | 6/2005 | Di Stefano | |
| 2005/0277281 A1* | 12/2005 | Dubin et al. | 438/618 |
| 2007/0069751 A1 | 3/2007 | Hantschel et al. | |
| 2008/0050561 A1* | 2/2008 | Joisten et al. | 428/156 |
| 2008/0217792 A1 | 9/2008 | Onodera et al. | |
| 2008/0242049 A1* | 10/2008 | Jung et al. | 438/457 |
| 2009/0001486 A1 | 1/2009 | Heck et al. | |
| 2009/0294941 A1 | 12/2009 | Oh et al. | |
| 2010/0019362 A1 | 1/2010 | Galera et al. | |
| 2010/0320598 A1* | 12/2010 | Murayama et al. | 257/737 |

OTHER PUBLICATIONS

Bagolini et al. "A Single Metal Layer MEMS Self-Assembling Coplanar Structure" *Journal of Micromechanics and Microengineering*, 17: 945-948 (2007).

\* cited by examiner

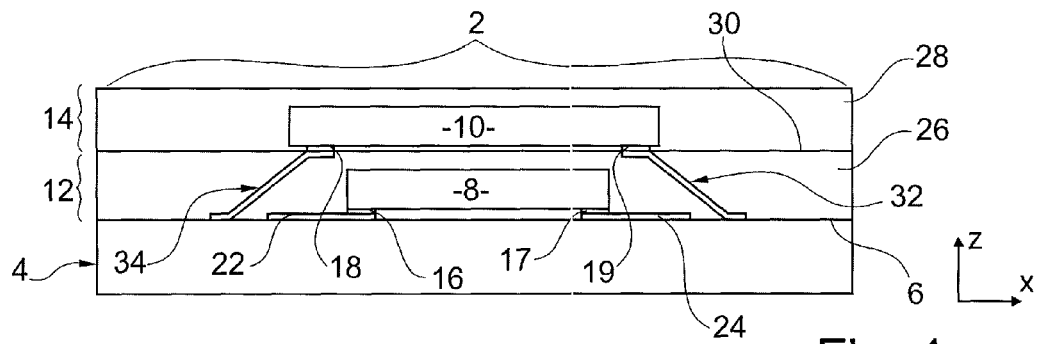
Fig. 1
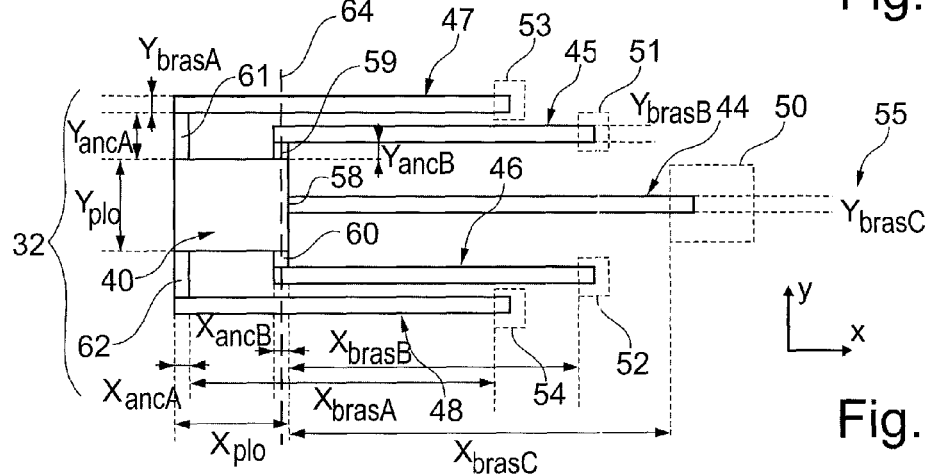
Fig. 2
Fig. 3
Fig. 4
Fig. 5
Fig. 6

METHOD FOR MANUFACTURING A MICROELECTRONIC DEVICE AND A MICROELECTRONIC DEVICE THUS MANUFACTURED

CROSS REFERENCE TO RELATED APPLICATIONS

This application claims the benefit of the Apr. 26, 2010 priority date of French Application No. 1053156, the contents of which are incorporated herein by reference.

BACKGROUND OF THE INVENTION

The invention pertains to a method for manufacturing a microelectronic device on a substrate and to the manufactured microelectronic device.

A microelectronic device is a device manufactured by a collective microelectronic manufacturing method. Thus, typically, a microelectronic device is manufactured by the stacking and etching of successive layers, for example by means of photo-lithography.

Microelectronic devices comprise at least one first electrical component and one second electrical component distributed respectively in first and second levels stacked one on top of the other on the substrate.

An electrical component is any component that needs to be electrically connected to another electrical component made on the same substrate in another level. For example, the electrical component is a microelectronic chip, a conductive track or an electrical interconnection.

The term "microelectronic chip" herein designates a piece of a semiconductive wafer. Preferably, this piece of wafer has one or more electronic components such as transistors, capacitors, resistors inductors, MOS (Metal Oxide Semiconductor) components, MEMS (microelectromechanical Systems) or NEMS (nanoelectromechanical systems) or the like. These components are etched or deposited on this piece of wafer by collective microelectronic manufacturing methods such as lithography, DRIE (Deep Reactive Ion Etching) or the like.

PRIOR ART

Prior art methods for manufacturing a microelectronic device of this kind comprise:
the manufacturing of at least one electrical pad whose width and length are greater than its thickness, this pad having an upper face, and then
the electrical connection of the second electrical component to said upper face to electrically connect this electrical component to the first electrical component by means of this pad.

For example, the patent application WO 2009/147 148 discloses a method for the manufacturing of a microelectronic device wherein an electrolytic interconnection, called a "second type" interconnection, passes right through a lateral encapsulating layer of a microelectronic chip in the first layer. This interconnection is made out of copper and has a substantial cross-section, i.e. a cross-section greater than 10 $\mu m^2$, to have a plain upper face that is wide enough to reliably set up electrical contact with the upper layer. Because of the substantial cross-section, when the microelectronic device is subjected to an increase in temperature, the pad expands greatly. This expansion can damage the microelectronic device.

Thus, there are two conflicting technical constraints:
1. The cross-section of the interconnection must be large in order to have a large upper face in order to accurately set up electrical contact with the upper layer, and
2. At the same time, the cross-section of the electrical interconnection must be small enough to restrict the problems related to expansion or to increase the density of the interconnections.

Furthermore, the cross-section cannot be made smaller than is permitted by the prior art in lithography and electrolysis. There is therefore a boundary value for the ratio between the height and the width of this interconnection. Finally, the manufacture of the electrical pad calls for a large number of steps, including especially the performance of electrolysis. This method is therefore fairly complex and lengthy, and hence costly.

SUMMARY OF THE INVENTION

The invention is aimed at resolving at least one of these drawbacks by proposing another mode of manufacture of these microelectronic devices.

An object of the invention therefore is a method of manufacture wherein:
the method also comprises the manufacture of at least one first arm and one second arm of different lengths, each of these arms directly and mechanically linking the electrical pad to a respective fixed anchoring point on the substrate, and
the electrical pad is made inside the first level and then shifted, prior to the electrical connection of the second component, to a position of connection wherein the upper face of the electrical pad is in contact with the interior of the second level parallel to the substrate.

Here below in this description, the upper face is assumed to be inside a level even when it is simply flush with this level.

The above method has many advantages. The shifting of the electrical pad from its position of manufacture to the connection position enables the simple manufacture of a pad having an upper face greater than 10 $\mu m^2$ without its being thereby connected to the lower level by a pillar having a large cross-section. The problems related to the expansion of the electrical pads are therefore restricted. At the same time, the possibility of setting up efficient electrical contact with the microelectronic chip of a higher level is preserved. For example, it remains possible to implant micro-inserts on the electrical pad and deposit a meltable ball thereon to set up the electrical contact with the second chip. A micro-insert is a deposit of material used to set up electrical contact by thermocompression. For example the material is nickel. This is a special advantage of this method relatively to the other methods where the electrical contact is provided by the tip of a leaf spring that gets supported on a flat surface.

This method of manufacture is a collective method of manufacture for simultaneously manufacturing a multitude of identical microelectronic devices on a same substrate. The implementation of this method of manufacture requires fewer steps than existing methods. For example, the conductive tracks within the first level and the electrical pad can be made during a same step. Nor is there a step of electrolysis in principle.

Finally, the use of at least two arms of different lengths enables the precise setting of the maximum height to which the electrical pad rises above the substrate in the connection position.

The embodiments of this method may have one or more of the following characteristics:

the method also comprises the manufacture of at least one third arm mechanically connecting the electrical pad to another fixed anchoring point on the substrate, the end of this third arm being attached to the electrical pad at a point of attachment spaced from the points of attachment of the first and second arms, the length of this third arm being chosen to keep the upper face of the electrical pad parallel to the substrate in the connection position;

the method comprises the manufacture of four arms of same length, each mechanically and directly connecting a respective point of attachment of the upper face to a respective fixed anchoring point on the substrate, and at least one arm of a different length mechanically and directly connecting the electrical pad to a respective anchoring point on the substrate;

the shifting of the electrical pad is actuated by means of a temperature variation and/or an external supply of electrical or magnetic energy;

the method comprises, after the steps of manufacturing and shifting the electrical pad, the cutting of the substrate to separate the manufactured electronic device from the other microelectronic devices manufactured at the same time on the same substrate;

the method comprises, before the stacking of the second level and after the shifting of the pad, a step for encapsulating the first level with an encapsulating material to form a base on which the second level is then stacked and to immobilize the electrical pad in its connection position;

the method comprises, after the shifting of the pad and after the stacking of the second level, a step for encapsulating the microelectronic device with an encapsulating material to immobilize the electrical pad in its connection position;

after the shifting of the pad, the method comprises the stacking of the second electrical component at least partly above the electrical pad so as to connect the electrical pad to an electrical contact made so as to be facing an external face of the second electrical component;

the manufacturing of the electrical pad is done at the same time as the manufacturing of the conductive tracks and/or the conductive pads of the first level on the substrate;

the first and/or second electrical components are microelectronic chips.

These embodiments of the method furthermore have the following advantages:

using at least one third arm makes it possible to adjust the flatness and the parallelism of the electrical pad in the connection position;

using at least five arms makes it possible to position the electrical pad at the desired height while at the same time keeping it parallel to the substrate;

using an external supply of energy or a temperature variation makes it possible to activate the shifting of the electrical pad at the desired time;

the cutting-out step enables the collective manufacture of several microelectronic devices on a same substrate;

the encapsulating of the first level before the stacking of the second level enables the constitution of a rigid base on which the second electronic component can be easily and precisely positioned without hollows or guiding pivots being provided between the first and second levels;

the encapsulating of several levels at the same time enables a gain in time and simplifies the method;

the stacking of the second electrical component above the electrical pad limits the number of conductive tracks to be etched in the second level;

the manufacture of the electrical pad at the same time as the manufacture of the conductive tracks of the first level simplifies the manufacturing method.

An object of the invention is also a microelectronic device comprising:

a substrate, at least one first and one second electrical component distributed respectively in first and second levels stacked one on top of the other on the substrate, at least one electrical pad, whose width and length are greater than its thickness, by means of which said first and second electrical components are electrically connected to each other, this electrical pad having an upper face, at least one first arm and one second arm of different lengths, each of these arms mechanically and directly connecting the electrical pad to a respective fixed anchoring point on the substrate.

The embodiments of this device may comprise the following characteristic:

the microelectronic device has a deposit of meltable or thermocompressible material to set up the electrical connection between the second electrical component and the pad.

BRIEF DESCRIPTION OF THE DRAWINGS

The invention will be understood more clearly from the following description, given purely by way of a non-exhaustive example and made with reference to the appended drawings, of which:

FIG. 1 is a schematic illustration of a microelectronic device comprising electrical components distributed in two stacked levels, FIG. 2 is a schematic illustration in a top view of an electrical interconnection between two of the components of the device of FIG. 1, FIGS. 3 and 4 are schematic illustrations of the interconnection of FIG. 2 in a manufacturing position respectively in a side view and a top view;

FIG. 5 is a schematic illustration of the interconnection of FIG. 2 in a connection position;

FIG. 6 is a graph illustrating the computation of the height h to which the interconnection of FIG. 2 rises in the connection position;

In these figures, the same references are used to designate the same elements.

MORE DETAILED DESCRIPTION

Figure 7:
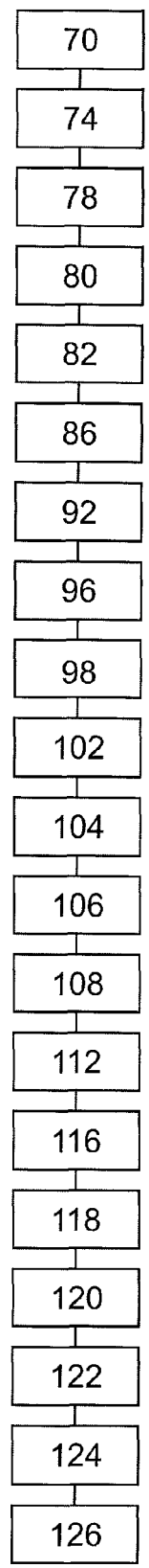
FIG. 7 is a flow chart of a method for manufacturing the device of FIG. 1.

Here below in this description, the characteristics and functions well known to those skilled in the art are not described in detail.

FIG. 1 shows a microelectronic device 2. This device 2 has a substrate 4 on which several electrical components are stacked. Here, the device 2 is described in the particular case in which these electrical components are microelectronic chips. Typically, the greatest dimension of a microelectronic chip is smaller than 5 mm.

The substrate 4 is a portion of a semiconductive wafer obtained after cutting-out step. This substrate is a plane substrate herein shown in a horizontal position. The horizontal position is identified by two orthogonal directions X and Y of which only the direction X can be seen in FIG. 1. In this figure, and in the following figures, the direction Z represents the vertical direction.

The substrate 4 has a plane upper face 6 on which conductive tracks are deposited or etched to connect the microelectronic chips to one another and to the different electronic components deposited on or integrated into the substrate 4. The conductive tracks extend only within a same level. Typically, tracks for supplying power to the different superimposed microelectronic chips are made on the upper face 6.

For the sake of simplification, FIG. 1 shows only two microelectronic chips 8 and 10 apportioned respectively to the levels 12 and 14. The level 14 is stacked on the level 12. Each level has a constant thickness and extends in parallel to the face 6.

These chips 8 and 10 have electrical contacts on their lower faces pointed towards the face 6. For example, the chips 8 and 10 respectively have electrical contacts 16, 17 and 18, 19. The contacts 16 and 17 are connected to conductive tracks 22 and 24 respectively, deposited or etched on the face 6. For example, the electrical connection of the contacts 16 and 17 on the tracks 22 and 24 is made by means of micro-inserts or meltable balls.

Each track 8, 10 is buried in its own encapsulating layer respectively, 26 and 28. These encapsulating layers extend laterally on the entire periphery of each of the chips. These encapsulating layers are used to protect and fix the chips on the substrate definitively. For example, they are made out of polymer such as an epoxy type resin. Here, the demarcation between the encapsulating layers 26 and 28 corresponds to the boundary between the levels 12 and 14.

The device 2 also has electrical interconnections to electrically connect the chips 8 and 10 to each other. Here, two interconnections 32 and 34 are shown. For example, each of these interconnections 32, 34 electrically connects the chip 10 to conductive tracks of the substrate electrically connected to the chip 8.

These interconnections go through the encapsulating layer 26 from one side to the other. An interconnection technology of this kind through the exterior of the chip is known as "chip-in-polymer" technology.

Here, the interconnections 32 and 34 are identical and only the interconnection 32 is described here below in greater detail.

FIGS. 2 to 5 give a more detailed view of a particular embodiment of the interconnection 32. The interconnection 32 has a mobile electrical pad 40. This pad 40 is designed to get placed beneath the chip 10 facing one of the electrical contacts of this chip, in this case the contact 19, to electrically connect the chip 10 to the substrate 4. The width and the length of the pad 40 are far greater than its thickness. The term "far greater" refers to the fact that the width and the length are at least 5, 10 or 50 times greater than the thickness. The upper face of the pad 40 is plane, and has a surface area of at least 10 µm² and preferably at least 100 µm² so as to enable the creation of a robust and reliable electrical connection with the chip 10.

The pad 40 can be shifted between a manufacturing position shown in FIGS. 3 and 4 and a connection position shown in FIGS. 1 and 5.

In the manufacturing position, the pad 40 is situated solely within the level 12. For example, in the manufacturing position, the pad 40 is separated from the face 6 of the substrate solely by the thickness of a sacrificial layer 42 (FIG. 3). For example, the thickness of the layer 42 is smaller than 10 µm.

In the connection position, the pad 40 rises above the substrate 4. Here, the distance between the pad 40 and the face 6 of the substrate in the connection position is denoted as h (FIG. 5). This height h is greater than or equal to the thickness of the level 12. Typically, the height h is greater than 20 µm or 100 µm.

Means for actuating the shifting of the pad 40 between these manufacturing and connection positions are provided in the device 2. For example, here, the interconnection 32 also has 5 rectilinear arms 44 to 48 mechanically connected, at one end, to the pad 40 and, at the other end, to a respective fixed anchoring point on the face 6. In FIG. 2, the anchoring points of the arms 44 to 48 are represented by squares of dashes, respectively 50 to 54. These anchoring points 50 to 54 are situated at different positions in FIG. 6.

The arms 44 to 48 extend in parallel to a same vertical plane 55 of which only the intersection with a horizontal face 6 is shown in FIG. 2. This plane 55 is perpendicular to the face 6.

Here, this plane 55 is also a plane of symmetry for the pad 40 and the arms 44 to 48. The pad 40, the arm 44 and the anchoring point 50 extend on either side of the plane 55.

In the manufacturing position (FIG. 3), the arms 44 to 48 extend also essentially in parallel to the face 6.

Here, in the connection position, the arms 44 to 48 are inclined relatively to the vertical and the horizontal. For example, the angle between the direction in which the arm extends and the face 6 ranges from 5° to 85°.

Each arm 44 to 48 has a cross-section whose surface area is, for example, smaller than some µm² or some hundreds of µm².

The end of each arm opposite the anchoring point is fixed to the pad 40 by a respective attachment point 58 to 62.

Here, the attachment points 58 to 60 of the arms 44 to 46 are aligned in a same axis 64 perpendicular to the plane 55. This alignment of the attachment points 58 to 60 is used here to adjust the height h with precision. The diagram of FIG. 6 explains the way in which the arms 44 to 46 act in order to fix the height h reached in the connection position. The axis 46 is situated on the circle arc C1 whose center O is determined by the position of the anchoring point 50. At the same time the axis 64 is situated on the circle arc C2 whose center B is determined by the position of the anchoring points 51 and 52. Should the length of the arm 44 be strictly greater than the length of the arms 45 and 46, the height h of the pad 40 in the connection position is given by the following relationship:

$$h = \left[ \frac{(1-k\Delta\Delta)^2(L^2+y^2)}{2} - \left(\frac{(1-k\Delta\Delta)^2(L+y)}{2}\right)^2 - \left(\frac{L-y}{2}\right)^2 \right]$$

where:

k is the heat expansion coefficient of the material used to make the arms,

ΔT is the difference in ° C. between the temperatures in the manufacturing position and in the connection position, L is the length of the arm 44 at the temperature T1 of manufacture of the interconnection 32, y is the length of the arms 45, 46 at the temperature T1.

Indeed when the interconnection 32, having been manufactured, is cooled, then since the arm 44 is longer than the arms 45 and 46, this interconnection no longer shrinks. This causes a tensile force to be exerted on the attachment point 58 which causes the pad 40 to be raised through the motion of the arms 45 and 46 which then act as levers until the height h is reached. Here, the arms which pull the pad 40 are called "actuating arms", while the other arms which exert compression forces are called "lever arms". In order that these means to actuate the shifting of the pad 40 may work, the centers O and B should no longer coincide. This condition is obtained by shifting the position of the anchoring points 51 and 52 along the axis X relatively to the position of the anchoring point 50 of the arm 44.

Furthermore, the distance between the centers O and B should be sufficient to enable the exertion of a tensile force capable of lifting the pad 40. This distance should however remain small enough to prevent the arm 44 from getting deformed by buckling. For example, this distance is determined experimentally with a simulation software program in taking account of the height h to be attained in the connection position.

Here, the pad 40 is rectangular. The attachment points 59 to 62 are positioned at each angle of the pad 40 to keep the upper face of the pad 40 parallel to the face 6 in the connection position. This arrangement of the attachment points 59 to 62 makes it possible to control the flatness of the pad 40 in the connection position. Preferably, this flatness must be controlled so that the distance between the highest point and the lowest point of the upper face of the pad 40 remains smaller than 50 μm and preferably smaller than 1 μm in the connection position. The length of the arms 45 to 48 is determined to control the flatness and parallelism of the upper face of the pad 40 relatively to the face 6 of the substrate. In the connection position, the upper face of the pad 40 is parallel to the face 6.

The length of the arm 44 should not be equal to the length of the other arms. The lengths of the arms 45 and 47 are not necessarily the same.

For example, the length of the arms 44 to 48 is determined here by experiment. For example, to this end, a digital model of the interconnection 32 and of these deformations is simulated.

By way of an illustration, the different dimensions of an interconnection 32 are within the ranges defined in the following table:

| Name of parameter in FIG. 2 | Min (μm) | Max (μm) |
|---|---|---|
| Xpad | 100 | 200 |
| Ypad | 100 | 200 |
| XarmC | 200 | 2000 |
| YarmC | 30 | 200 |
| XarmA | 200 | 2000 |
| YarmA | 30 | 50 |
| XancA | 10 | 200 |
| YancA | 10 | 30 |
| XarmB | 200 | 2000 |
| YarmB | 30 | 50 |
| XancB | 10 | 200 |
| YancB | 10 | 30 |

Here, the arms 44 to 48, the anchoring points 50 to 54 and the pad 40 are made out of one and the same electrically conductive material. Here, at least one of these arms fulfills the role of an electrical conductor electrically connecting the pad 40 to the tracks of the substrate 4. For example, the material used is copper. More specifically, the interconnection 32 is made out of one and the same layer of this electrically conductive material.

FIG. 7 shows an example of a method for manufacturing the device 2.

Initially, at a step 70, a wafer is provided. On this wafer, several devices 2 are made simultaneously. Thus, the conductive tracks of several microelectronic devices are made. This wafer can also integrate electronic components. To simplify the description of FIGS. 8 to 28:

only one cross-section of this wafer corresponding to a single microelectronic device is illustrated at the different manufacturing stages, only the manufacturing of the interconnection 32 is illustrated, and the arms 45 to 48 of the interconnection 32 have been omitted.

Figure 8:
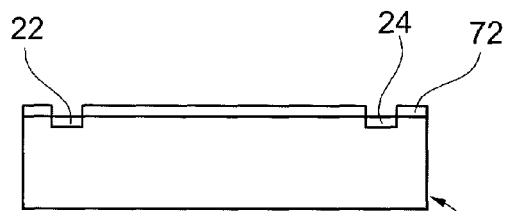
FIGS. 8 to 24 are schematic illustrations, in a side view, of different manufacturing steps of the method of FIG. 7.
Figure 9:
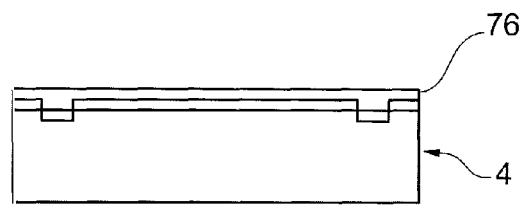
Figure 10:
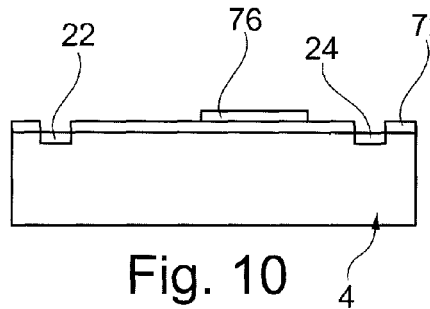
Figure 11:
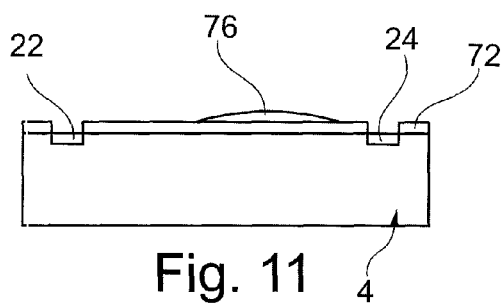
Figure 12:
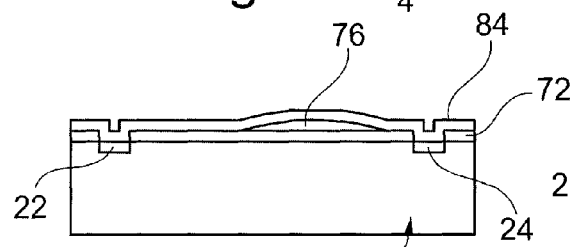
Figure 13:
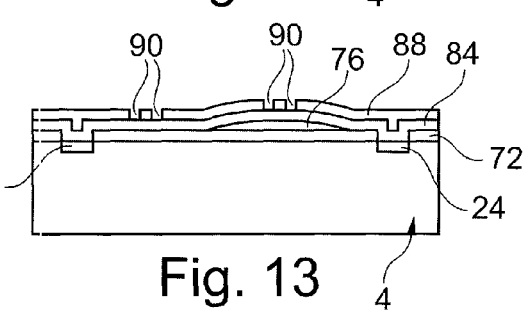
Figure 14:
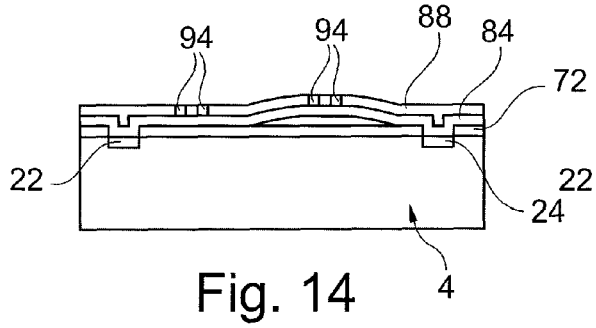
Figure 15:
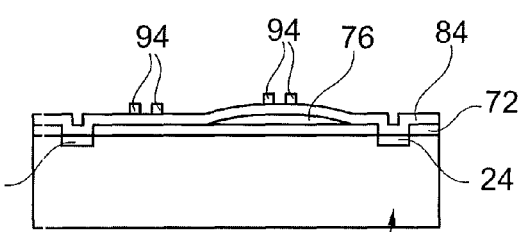
Figure 16:
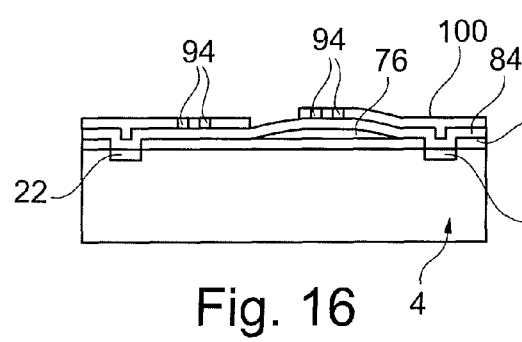
Figure 17:
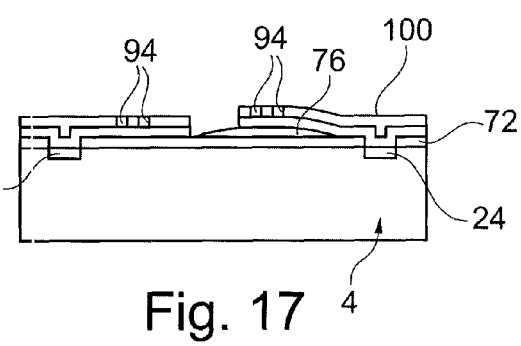
Figure 18:
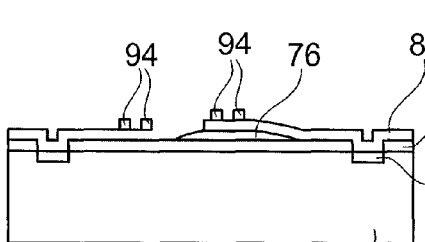
Figure 19:
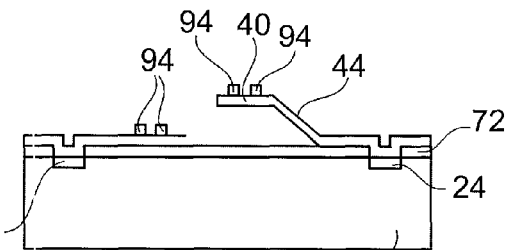
Figure 20:
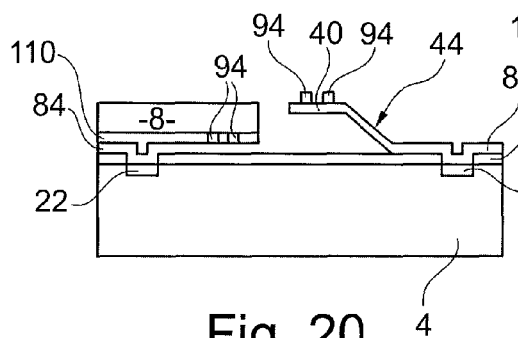
Figure 21:
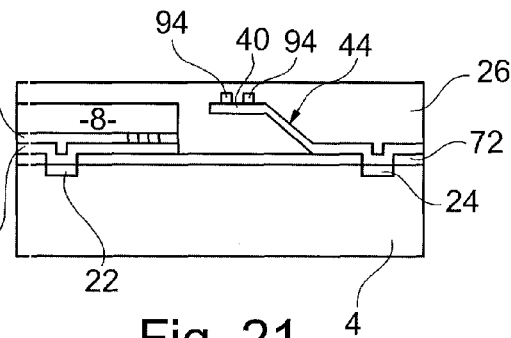
Figure 22:
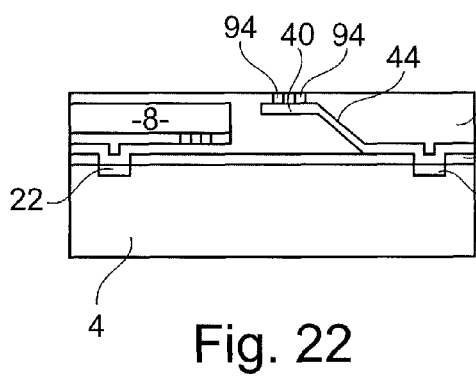
Figure 23:
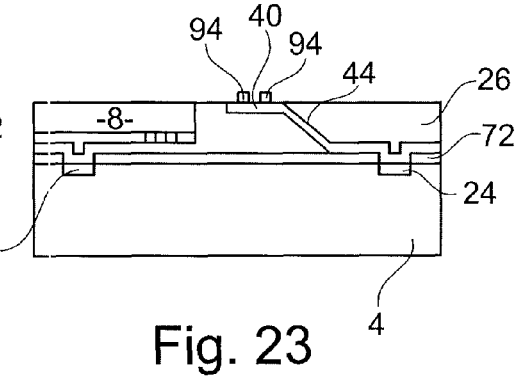
Figure 24:
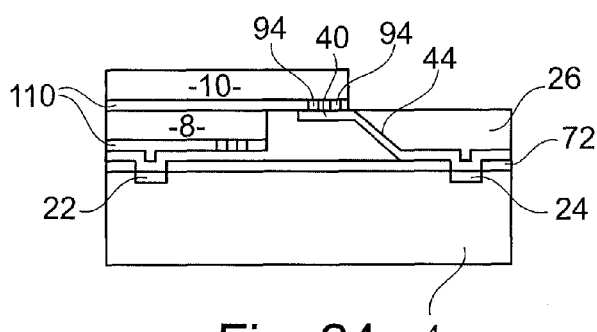

FIG. 8 shows the cross-section of the wafer corresponding to the device 2 at the very start of its manufacture. This wafer forms the substrate 4 on which conductive tracks 22 and 24 are deposited or etched. A dielectric layer 72 covers the entire face 6 of the substrate 4 except for the conductive tracks 22 and 24.

Then, at a step 74 (FIG. 9), a sacrificial layer 76 is deposited on the substrate 4. For example, this layer 76 is a resin.

At a step 78 (FIG. 10), the sacrificial layer 76 is structured, for example by lithography, to allow the sacrificial layer to remain solely on the pad 40 and the arms 44 to 48.

Then, at a step 80 (FIG. 11), the sacrificial layer 76 is annealed so as to obtain a domed shape.

At a step 82 (FIG. 12), a metal layer 84 is deposited on the entire upper face 6 of the substrate 4. This deposit is made for example at a depositing temperature T1 greater than or equal to 200° C.

At a step 86 (FIG. 13), a layer 88 of photosensitive resin is deposited on the metal layer 84 and then structured by photolithography to make housings 90 in which metal micro-inserts have to be made.

At a step 92 (FIG. 14) a conductive metal material 94 is deposited in the housings 90 prepared during the step 86. These metal deposits then form micro-inserts 94 directly deposited on the conductive layer 84.

Then, at a step 96 (FIG. 15) the photosensitive resin 88 is eliminated so as to expose the micro-inserts 94.

At a step 98 (FIG. 16), a new layer 100 of photosensitive resin is deposited on the substrate 4 and then structured, for example by photolithography so as to demarcate the locations at which the different conductive tracks of the substrate 4 and the interconnections 32, 34 must be made.

At a step 102 (FIG. 17) the same layer 84 is etched to form the conductive tracks of the level 12 as well as interconnections 32 and 34. These conductive tracks serve, for example, to connect at least one of the anchoring points of the arms 50 to 54 to the tracks 22 and 24. These conductive tracks are fixed and are not led to shift subsequently.

At a step 104 (FIG. 18), the layer 100 of photosensitive resin is removed.

At a step 106 (FIG. 19), the sacrificial layer 76 is also eliminated and the temperature is lowered to a temperature T2. For example, the temperature T2 is lower than or equal to 100° C. Here, the temperature T2 is close to 80° C. The elimination of the sacrificial layer 76 releases the pad 40 and the arms 44 to 48. The lowering of the temperature actuates the shifting of the pad 40 from its manufacturing position to its connection position.

At a step 108 (FIG. 20), the chip 8 is hybridized at the first level. At this step, a layer of bonder 110 is deposited at the position at which the chip should be bonded. The chip 8 is then deposited on this layer of border and put into electrical contact with the layer 84 and the tracks 22, 24 by means of the micro-inserts 94.

Then, at a step 112 (FIG. 21), a lateral encapsulation is made on the chip 8. This encapsulation consists of the spreading of polymer all around the chip 8 and also, in this case, on its upper face. The pad 40 as well as the micro-inserts 94 implanted on this pad are entirely embedded in the encapsulating layer 26. After deposition, the hardened layer 26 fixes the chip 8 definitively to the substrate 4. The hardening of the layer 26 also immobilizes the interconnection 32 in its connection position At a step 116 (FIG. 22), the encapsulating layer 26 is thinned and planarized by mechanical machining. For example, to this end the invention uses the CMP (chemical mechanical polishing) process. This thinning causes the micro-inserts 94 implanted on the pad 40 to be flush with the level of the upper face of the encapsulating layer 26.

Then, at a step 118 (FIG. 23), the encapsulating layer 26 is etched on the thickness of the micro-inserts 94 so that the upper face of the pad 40 is now flush.

At a step 120 (FIG. 24), the second chip 10 is hybridized. The hybridizing of the second chip 10 is, for example, done as described for the step 108. The chip 10 is stacked above the pad 40 so that its electrical contact 19 (not shown in FIG. 24) faces the pad 40. The pad 40 is then electrically attached to the chip 110 by means of the micro-inserts 94.

At a step 122, the chip 10 is laterally coated.

Once this encapsulation has been done, at a step 124, the different identical micro-electronic devices manufactured on the same wafer are separated from one another in a cutting-out step 124.

At a step 126, after this cutting-out step, the different microelectronic devices comprise chips stacked on one another are for example incorporated in packages equipped with lugs or connection pins enabling them to be connected to an electronic board or to an electrical circuit.

Figure 25:
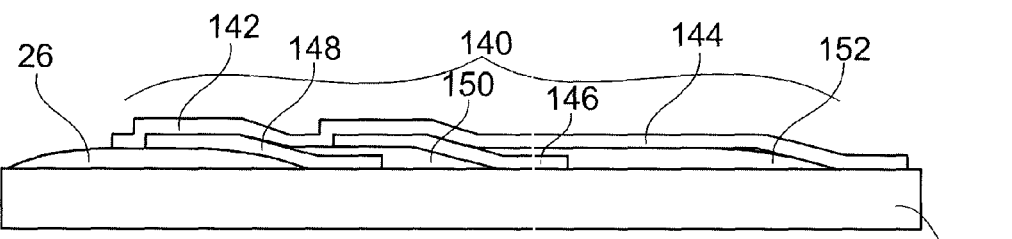
FIG. 25 is a schematic illustration of a side view of another embodiment of the interconnection of FIG. 2.
Figure 26:
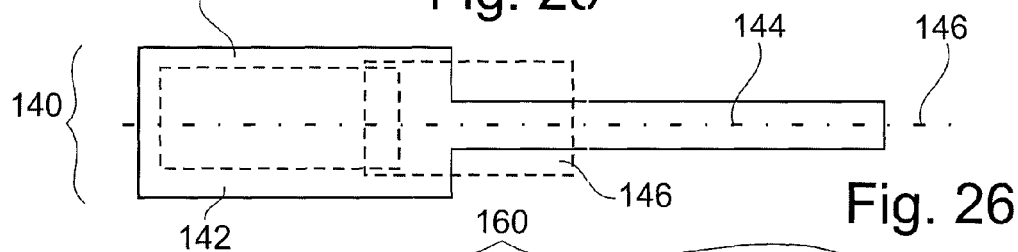
FIG. 26 is an illustration of a top view of the interconnection of FIG. 25.

FIGS. 25 and 26 represent another possible embodiment of an interconnection 140 liable to be used in the device 2 instead of the interconnection 32 or 34. This interconnection 140 is distinguished from the interconnection 32 by the fact that only three arms are used instead of the five arms described here above.

They comprise:
  a mobile pad 142 similar to the pad 40, and
  an arm 144, for example identical to the arm 44 which extends in a vertical plane of symmetry 146.

In this embodiment, the arms 45 and 46 are replaced by one and the same arm 146. This arm 146 is obtained for example by joining the arms 45 and 46 to form only one plane extending beneath the arm 144. The arms 47 and 48 also replaced by a single arm 148 obtained for example by joining the arms 47 and 48 of the interconnection 32 to form only one plane extending beneath the arm 146.

An interconnection 140 of this kind is made by using several blocks 149, 150 and 152 of sacrificial layers situated directly on respectively the pad 142, the arm 146 and the arm 144.

When the sacrificial blocks 149, 150 and 152 are eliminated, they release the interconnection 140, and the pad 142 can then be shifted from its manufacturing position shown in FIG. 25 to a connection position.

Figure 27:
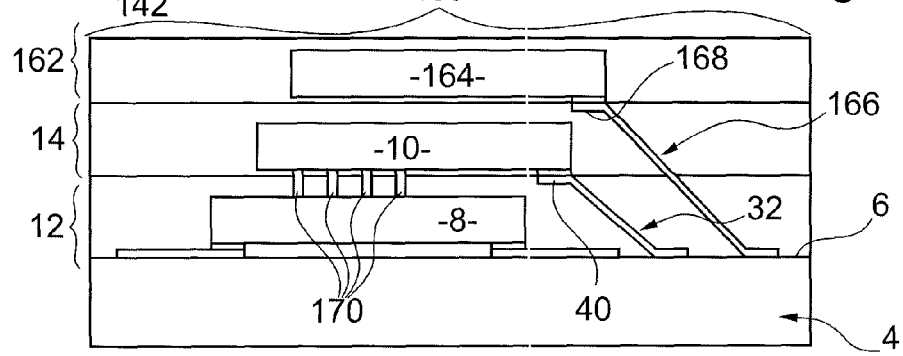
FIG. 27 is a schematic illustration of another microelectronic device that can be manufactured by means of the method of FIG. 7.

FIG. 27 shows another embodiment of a microelectronic device 160. This device 160 is similar to the device 2 except that, in addition to the levels 12 and 14, it has a third level 162 that is stacked above the level 14 and has a microelectronic chip 164 housed in it.

The chip 164 is electrically connected to the chips 8 and 10 by means of an interconnection 166 which electrically connects it directly to the upper face 6 of the substrate 4. This interconnection 166 is made similarly to the interconnection 32 except that the arms are sized to raise the electrical pad 168 not to the same height as the pad 40, but to an appreciably greater height so that this pad 168 is situated within the level 162. For example, in the connection position, the pad 128 rises to a height h greater than or equal to twice the height h.

If necessary, micro-inserts are made between the upper face of one of the chips, and the lower face directly facing the chip of the upper level to directly connect the electrical contacts of these faces. By way of an illustration, in FIG. 27, the upper face of the chip 8 is connected to the lower face of the chip 10 by micro-inserts 170 which extend only vertically.

Figure 28:
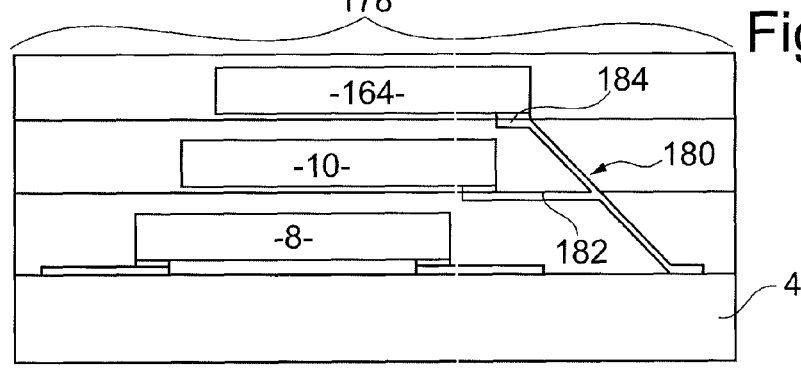
FIG. 28 is also another embodiment of a microelectronic device made by using the teaching of the method of FIG. 7.
Figure 29:
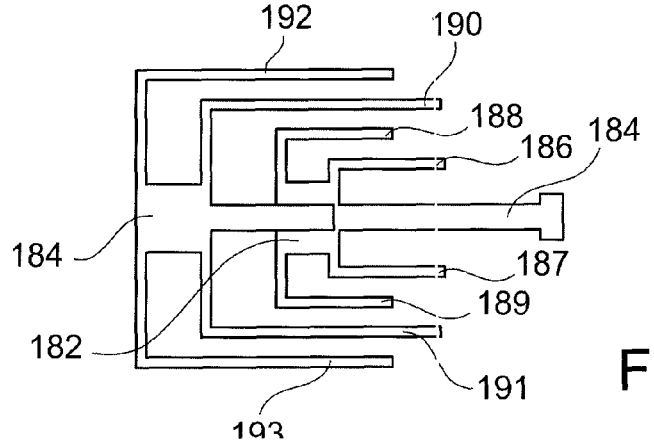
FIG. 29 is an illustration in a top view of an interconnection particularly implemented in the device of FIG. 28.

FIGS. 28 and 29 show another possible embodiment of an interconnection 180 capable of electrically connecting the chips 10 and 64 of FIG. 27.

To this end, the interconnection 170 has two pads 182 and 184, similar to the pad 40, connected to the substrate 4 by means of a common arm 184 and respective lever arms 186 to 189 and 190 to 193.

The arm 184 fulfills the same function as the arm 44. For example, the arm 184 is identical to the arm 44 except that it extends from an anchoring point up to the pad 184 in passing through the pad 182.

The arms 186 to 189 and 190 to 193 fulfill the same functions as the arms 45 to 48 respectively in respect of the pads 182 and 184.

Figure 30:
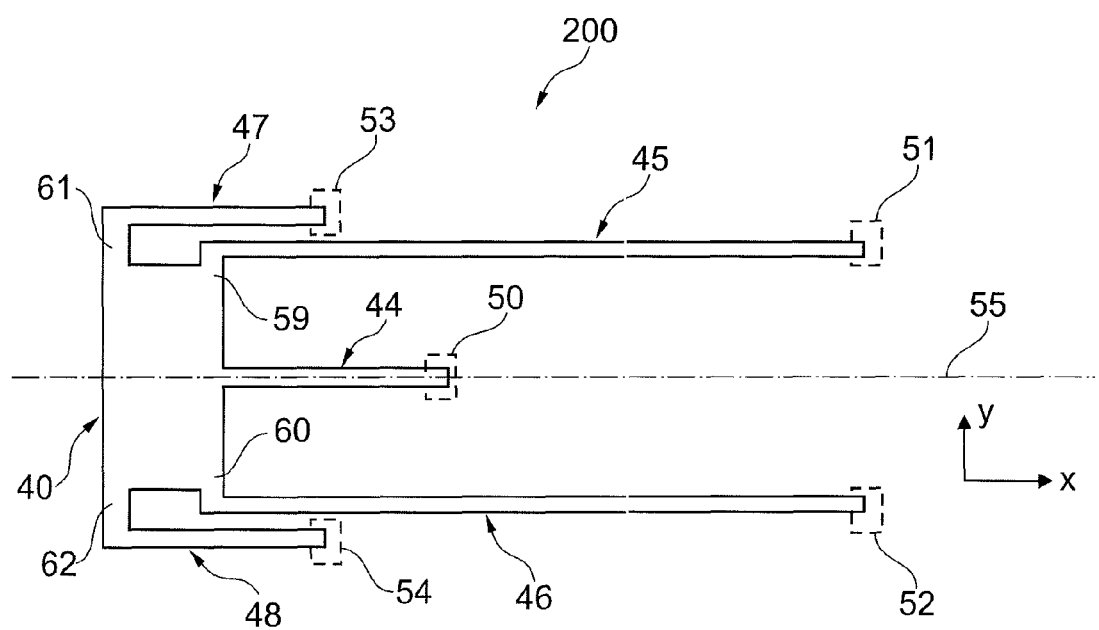
FIG. 30 is a schematic illustration in a top view of another example of an embodiment of the electrical interconnection.

FIG. 30 shows an interconnection 200 identical to the interconnection 32 except that the lengths of the arms in the direction X have been modified. More specifically, in this embodiment, the length of arms 44, 47 and 48 is strictly smaller than the length of the arms 45 and 46. Preferably, the length of the arms 44, 47 and 48 is at least two, three or four times smaller than the length of the arms 45 and 46. For example, the length of the arm 44 is equal to the length of the arms 47 and 48 plus or minus 30%. Here, the lengths of the arms 44, 47 and 48 are equal. In this embodiment, the arms 45 and 46 are actuation arms while the arms 44, 47 and 48 are lever arms.

Many other embodiments are possible. For example, the micro-inserts 94 can be replaced by any means capable of connecting a contact of a micro-electronic chip to an electrical pad facing this contact. For example, a meltable ball can be used instead of the micro-inserts.

The conductive plates can be multi-layered plates with an adhesive sublayer.

Other means for actuating the shifting of the mobile pad can be used. For example, the electrical pad may be mechanically fixed to an actuation arm itself formed by a superimposition of several layers made out of materials having different coefficients of expansion. In this case, the actuation arm works as a bimetallic strip.

The actuation arm or arms can also be made out of a piezoelectric material so as to shift the mobile pad from the manufacturing position to the connection position. In this case, electrical tracks which can make the current flow in these piezoelectric arms are provided especially on the substrate 4.

The mobile pad can also be shifted through the use of electrostatic forces. For example, to this end, the pad or one arm is fitted out with a conductive plate charged with a certain polarity and a plate of opposite polarity is formed, for example on the substrate, to repel the plate fixedly joined to the mobile plate.

The actuation means can also be magnetic means. For example, the pad or one of the arms is made out of a magnetic or magnetizable material. Facing these arms or pads made of magnetic material, a coil or a controllable magnet is created so as to repel the electrical pad or, on the contrary, attract this electrical pad. This coil will typically be formed on the face 6 of the substrate 4.

In another embodiment, the actuation means are shape-memory materials. In this case, the shifting of the mobile pad between its manufacturing and connection positions is, for example, actuated by the passage of an electrical current.

The interconnection described here can also be used to electrically connect a microelectronic chip situated at a level N to a microelectronic chip situated at a lower level N−1, the level N−1 being strictly greater than 1. This amounts to making the interconnection on a substrate which already contains a microelectronic chip or a stack of microelectronic chips. For example, an interconnection similar to the interconnection 32 can be manufactured on the level 12 to directly connect the chip 10 to the chip 164 of FIG. 27 without using conductive tracks of the level 12, i.e. the tracks etched on the substrate 4. The method for manufacturing this interconnection is, for example, the same as the one described in FIG. 7 except that the substrate on which the interconnection is made already includes the substrate 4 and the level 12.

The pad 40 is not necessarily rectangular. For example it may be circular or have other shapes. In these latter cases, the width and the length of the pad correspond to the two most characteristic dimensions of the upper face of the pad. In the case of a circular face, the width and the length are equal to the diameter.

The lever arms or actuating arms are not necessarily rectilinear. For example, an arm may have a spiral shape.

The method described here enables the stacking and electrical connection of two or more levels of electrical components and thus the forming of a low-cost 3D type microelectronic device.

The encapsulating of the electrical components of each level can also be done after the pads are shifted to their connection position or after the electrical components of the upper levels are connected to these pads. Thus, a single encapsulating step is implemented to coat several levels at the same time.

The invention claimed is:

1. A method for manufacturing a microelectronic device on a substrate having at least one first electrical component and one second electrical component distributed respectively in first and second levels stacked one on top of the other on the substrate, said method comprising:
    manufacturing at least one electrical pad in said first level, said electrical pad having a width and length that are each greater than a thickness thereof, said electrical pad having an upper face,
    electrically connecting the second electrical component to said upper face to electrically connect said second electrical component to the first electrical component using said electrical pad,
    manufacturing at least one first arm and one second arm of different lengths, each of the first and second arms directly and mechanically linking the electrical pad to a respective fixed anchoring point on the substrate, and
    prior to the electrical connection of the second component, shifting the electrical pad to a connection position in which the upper face of the electrical pad is in contact with the interior of the second level and parallel to the substrate.

2. The method of claim 1, wherein at least one of the arms comprises an electrically conductive material thereby enabling said arm to electrically connect the electrical pad to tracks on the substrate.

3. The method of claim 1, further comprising manufacturing at least one third arm mechanically connecting the electrical pad to another fixed anchoring point on the substrate, the end of said third arm being attached to the electrical pad at a point of attachment spaced from the points of attachment of the first and second arms, the length of said third arm being chosen to keep the upper face of the electrical pad parallel to the substrate in the connection position.

4. The method of claim 3, further comprising manufacturing:
    at least four arms of same length, each mechanically and directly connecting a respective point of attachment of the upper face to a respective fixed anchoring point on the substrate, and
    at least one arm of a different length mechanically and directly connecting the electrical pad to a respective anchoring point on the substrate.

5. The method of claim 1, wherein shifting of the electrical pad comprises actuating the shift by causing a temperature variation and/or providing an external supply of electrical or magnetic energy.

6. The method of claim 1, further comprising, after manufacturing and shifting the electrical pad, subdividing the substrate to isolate the manufactured electronic device from other microelectronic devices concurrently manufactured on the same substrate.

7. The method of claim 1, further comprising, after shifting the electrical pad, encapsulating the first level with an encapsulating material to form a base, and stacking the second level on the first level to immobilize the electrical pad in the connection position.

8. The method of claim 7, further comprising, after shifting the electrical pad, and after stacking the second level, encapsulating the microelectronic device with an encapsulating material to immobilize the electrical pad in the connection position.

9. The method of claim 1, further comprising, after shifting of electrical pad, stacking the second electrical component at least partly above the electrical pad so as to connect the electrical pad to an electrical contact made on an external face of the second electrical component, said external face facing the electrical pad.

10. The method of claim 1, wherein manufacturing the electrical pad comprises manufacturing the electrical pad concurrently with manufacturing conductive tracks or conductive pads of the first level on the substrate.

11. The method of claim 1, wherein at least one of the first or second electrical components comprises a microelectronic chip.

12. The method of claim 1, wherein the width and the length of the electrical pad are each at least five times greater than the thickness thereof.

* * * * *